(12) United States Patent
Halimaoui et al.

(10) Patent No.: US 6,969,661 B2
(45) Date of Patent: Nov. 29, 2005

(54) METHOD FOR FORMING A LOCALIZED REGION OF A MATERIAL DIFFICULT TO ETCH

(75) Inventors: Aomar Halimaoui, La Terrasse (FR); Daniel Bensahel, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 23 days.

(21) Appl. No.: 10/744,680

(22) Filed: Dec. 23, 2003

(65) Prior Publication Data

US 2005/0026457 A1 Feb. 3, 2005

(30) Foreign Application Priority Data

Dec. 27, 2002 (FR) .................................... 02 16800

(51) Int. Cl.[7] .................. H01L 21/336; H01L 21/3205
(52) U.S. Cl. .................... 438/287; 438/299; 438/591; 438/763
(58) Field of Search ................ 438/591, 287, 438/585, 180, 229, 299, 785, 752, 183, 763; 257/E21.131, E21.092, E21.085

(56) References Cited

U.S. PATENT DOCUMENTS

| 5,134,090 | A | * | 7/1992 | Bean et al. .................. 438/492 |
| 5,427,630 | A | * | 6/1995 | Cabral et al. .............. 148/33.2 |
| 6,074,919 | A | | 6/2000 | Gardner et al. |
| 6,300,203 | B1 | | 10/2001 | Buynoski et al. |
| 6,306,741 | B1 | * | 10/2001 | Lee et al. ................... 438/585 |
| 6,376,347 | B1 | * | 4/2002 | Ohmura et al. ............. 438/585 |
| 6,436,774 | B1 | * | 8/2002 | Lee et al. ................... 438/287 |
| 6,495,890 | B1 | | 12/2002 | Ono |
| 6,617,202 | B2 | * | 9/2003 | Lee ............................ 438/149 |
| 6,713,333 | B2 | * | 3/2004 | Mayuzumi .................. 438/197 |
| 2002/0100947 | A1 | | 8/2002 | Lee et al. |
| 2002/0173106 | A1 | | 11/2002 | Lee et al. |
| 2002/0177244 | A1 | | 11/2002 | Hsu et al. |
| 2003/0068848 | A1 | | 4/2003 | Hsu et al. |
| 2003/0207127 | A1 | * | 11/2003 | Murthy et al. .............. 428/446 |

OTHER PUBLICATIONS

French Search Report from French Patent Application 02/16800, filed Dec. 27, 2002.

* cited by examiner

*Primary Examiner*—Olik Chaudhuri
*Assistant Examiner*—Lex H. Malsawma
(74) *Attorney, Agent, or Firm*—Lisa K. Jorgenson; James H. Morris; Wolf, Greenfield & Sacks, P.C.

(57) ABSTRACT

A method for forming, in an integrated circuit, a localized region of a material difficult to etch, including the steps of forming a first silicon oxide layer having a thickness smaller than 1 nm on a silicon substrate; depositing, on the first layer, a second layer selectively etchable with respect to the first layer; forming in the second layer an opening according to the pattern of said localized region; selectively growing on the second layer, around the opening, a germanium layer, the material of the second layer being chosen to enable this selective growth, whereby there exists in the germanium an opening conformable with the above opening; depositing the material difficult to etch so that it does not deposit on the germanium; depositing a conductive layer to fill the opening in the germanium; performing a leveling to expose the germanium; and removing the germanium and the first and second layers.

9 Claims, 3 Drawing Sheets

METHOD FOR FORMING A LOCALIZED REGION OF A MATERIAL DIFFICULT TO ETCH

BACKGROUND OF THE INVENTION

1. Field of the Invention

The present invention generally relates to the forming of integrated circuits on a silicon substrate. More specifically, the present invention relates to the forming of localized regions of a material difficult to etch. "Difficult to etch" means in the present description a lack of etch selectivity with respect to the materials used in the standard silicon circuit manufacturing process, or the fact that the usable chemicals would be polluting for the other integrated circuit elements.

Such materials are, for example, materials with a high dielectric permittivity intended to form the inter-electrode insulator of a capacitive element or a MOS transistor gate insulator. "Materials with a high dielectric permittivity" is used to designate in the present description insulators with a dielectric permittivity up to from one hundred to one thousand times greater than that of silicon oxide ($SiO_2$). Among such insulators, metal oxides of type $MO_2$, $MSi_xO_y$, or $MAl_xO_y$, where x and y designate integers and M a metal atom selected from among the group comprising hafnium, zirconium, lanthanum, and aluminum can be found.

More specifically, the present invention relates to the forming of such elements comprising an insulator of high dielectric permittivity.

2. Discussion of the Related Art

FIGS. 1A and 1B illustrate, in a simplified partial cross-section view, successive steps of the forming of an insulated gate of a MOS transistor according to another known method.

As illustrated in FIG. 1A, a thin layer of an insulator 2, followed by a conductive layer 3, are successively deposited on a semiconductor substrate 1, typically silicon.

Then, as illustrated in FIG. 1B, an insulated gate 4 is defined by etching the stacking of insulator 2 and of conductive layer 3. Insulator 2 typically is a silicon oxide ($SiO_2$) resulting either from a chemical vapor deposition (CVD), or from a thermal oxidation of the surface of substrate 1. Conductive layer 3, intended to form the gate electrode, generally is polysilicon.

In modern technologies, the gate lengths are more and more reduced, and the thickness of insulator 2 must be reduced. However, it is not possible, for physical reasons, to reduce the thickness of an insulator beyond a given limit on the order of 1.5 nm. This limits the possibility of reduction of the gate electrode dimensions.

To enable additional reduction of dimensions, it has been attempted to use as an insulator 2 insulating materials with a high dielectric permittivity. However, such insulators are difficult to etch. To avoid any etching, it has been devised to implement a method of damascene type.

FIG. 2 illustrates, in a partial simplified cross-section view, an intermediary step of a damascene method. Such a method consists of repeating, for each insulating or conductive element 2 intended to form the insulated gate, the succession of steps consisting of depositing an insulating layer, opening it according to the gate contour, depositing the layer of the material difficult to etch, and leveling the surface, generally by chem.-mech polishing (CMP). The structure thus obtained is illustrated in FIG. 2, in which reference numeral 21 designates a first insulator, reference numeral 2 designates the gate insulator difficult to etch, reference 22 designates a second insulator, and reference 3 designates the gate conductor. Then, to obtain the structure illustrated in FIG. 1B, insulators 21 and 22 are selectively removed.

This method has several disadvantages. Especially, insulating layers, one at least of which usually is silicon nitride, are used as intermediary layers 21, 22. The silicon nitride imposes on underlying substrate 1 mechanical constraints such that its crystal structure is deformed. This alters the performance, not only of the formed capacitive element, but also of the neighboring devices. In particular, in the case of the forming of a transistor, the doping profiles of the channel and of the subsequently-formed source/drain regions are affected.

Similar problems are encountered upon integration of any capacitive element comprising as an inter-electrode insulator an insulator of high dielectric permittivity.

SUMMARY OF THE INVENTION

The present invention aims at providing a method of localized forming of an insulating material with a high dielectric permittivity.

The present invention aims at providing such a method which overcomes some disadvantages of known methods.

The present invention aims at providing such a method which enables formation of an insulated gate of a MOS transistor.

The present invention also aims at providing such a method which enables formation of a capacitor of metal-insulator-metal (MIM) type.

To achieve these and other objects, the present invention provides a method for forming, in an integrated circuit, a localized region of a material difficult to etch, comprising the steps of forming a first silicon oxide layer having a thickness smaller than 1 nm on a silicon substrate; depositing, on the first layer, a second layer selectively etchable with respect to the first layer; forming in the second layer an opening according to the pattern of said localized region; selectively growing on the second layer, around the opening, a germanium layer, the material of the second layer being chosen to enable this selective growth, whereby there exists in the germanium an opening conformal with the above opening; depositing the material difficult to etch so that it does not deposit on the germanium; depositing a conductive layer to fill the opening in the germanium; performing a leveling to expose the germanium; and removing the germanium and the first and second layers.

According to an embodiment of the present invention, the substrate is made of silicon.

According to an embodiment of the present invention, the second layer is made of amorphous silicon.

According to an embodiment of the present invention, the second layer has a thickness from 2 to 3 nm.

According to an embodiment of the present invention, the first oxide layer has a thickness of from 0.5 to 0.7 nm.

According to an embodiment of the present invention, the germanium is deposited from a germane and hydrogen mixture at a temperature from 350 to 600° C.

According to an embodiment of the present invention, the material difficult to etch being an insulator with a high dielectric permittivity selected from the group comprising $MO_2$, $MSi_xO_y$, or $MAl_xO_y$, where x and y designate integers, and M a metal atom selected from the group comprising hafnium, zirconium, lanthanum, and aluminum.

According to an embodiment of the present invention, the deposition of the material difficult to etch is performed by an atomic layer chemical vapor deposition method (ALPCVD).

According to an embodiment of the present invention, the deposition of the material difficult to etch is preceded with a removal of the exposed portion of the first oxide layer at the bottom of the opening and with a processing capable of privileging the growth of the material difficult to etch on the substrate rather than on the germanium.

The foregoing objects, features, and advantages of the present invention will be discussed in detail in the following non-limiting description of specific embodiments in connection with the accompanying drawings.

DETAILED DESCRIPTION

For clarity, the same elements have been designated with the same references in the different drawings and, further, as usual in the representation of integrated circuits, the various drawings are not drawn to scale.

FIGS. 3A to 3G illustrate, in a partial simplified cross-section view, successive steps of a MOS transistor insulated gate formation method according to an embodiment of the present invention.

Figure 3A:
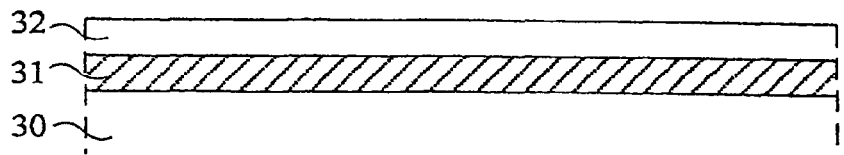
FIGS. 3A to 3G illustrate, in a partial simplified cross-section view, successive steps of an insulated gate forming method according to an embodiment of the present invention.

As illustrated in FIG. 3A, the method according to the present invention starts with the forming, on a single-crystal semiconductor substrate 30, of a thin layer 31. Layer 31 is selectively etchable with respect to underlying substrate 30. Additional elements for selecting the nature and the thickness of layer 31 will be detailed hereafter.

For example, assuming that substrate 30 is made of silicon, layer 31 preferably is a silicon oxide layer formed, by thermal oxidation or by CVD, over a thickness corresponding to a few atomic layers, ranging between 0.5 and 0.7 nm.

A layer 32 of a material selectively etchable with respect to layer 31 is then deposited. Other criteria of the choice of the nature and of the thickness of layer 32 will be discussed hereafter. Layer 32 is, for example, an amorphous silicon layer deposited at low temperature, of a thickness ranging between 2 and 3 nm.

Figure 3B:
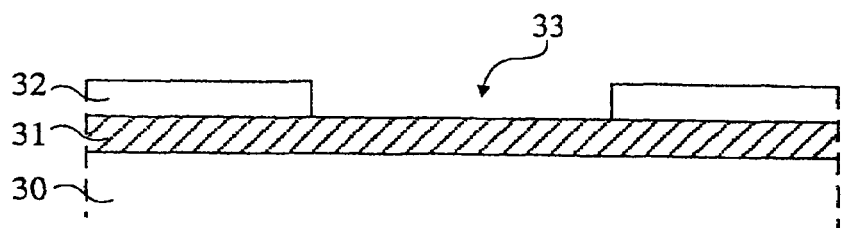

As illustrated in FIG. 3B, an opening 33 is formed in silicon layer 32. Opening 33 exhibits, in top view (not shown) the contour which is desired to be given to an insulated gate of a MOS transistor and to a contact point of such an electrode.

Figure 3C:
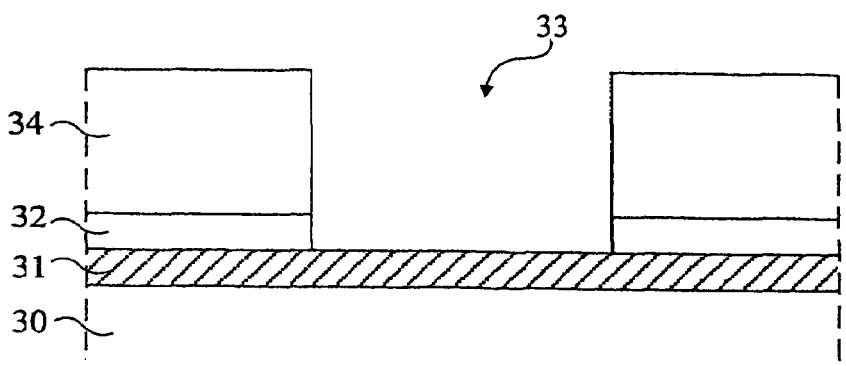

As illustrated in FIG. 3C, a selective deposition of a layer 34 is caused at the next steps on the single layer 32 around opening 33. Opening 33 is thus deepened by the thickness of layer 34. The thickness of layer 34 is equal to the thickness which is desired to be given to the insulated gate, for example, on the order of from 100 to 200 nm.

Layer 34 is made of a material capable of being selectively deposited on layer 32 without being deposited on the material forming layer 31 present at the bottom of opening 33. Layer 34 is, for example, single-crystal or multiple-crystal germanium.

Indeed, according to the present invention, it is possible to grow germanium at the surface of a material such as silicon from a mixture of from 1 to 20% of germane in hydrogen at relatively low temperatures, comprised between 350 and 650° C. The growth is then selectively performed, no deposition occurs on the surfaces coated with oxide layer 31. Further, this growth is substantially vertical. As an example, a germanium deposition at a growth speed of 2 nm/hour by taking a $GeH_4$ flow rate (at 10% in $H_2$) of 500 $cm^3$/mn, a hydrogen flow rate of 20 P/mn and a 450° C. temperature is obtained.

Figure 3D:
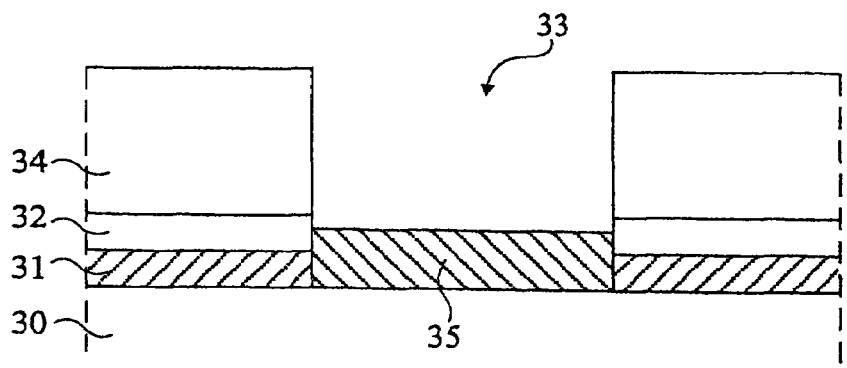

Then, as illustrated in FIG. 3D, an insulator with a high dielectric permittivity 35 is deposited in opening 33, selectively only at the bottom of opening 33. This significant step of the present invention will be detailed hereafter.

Figure 3E:
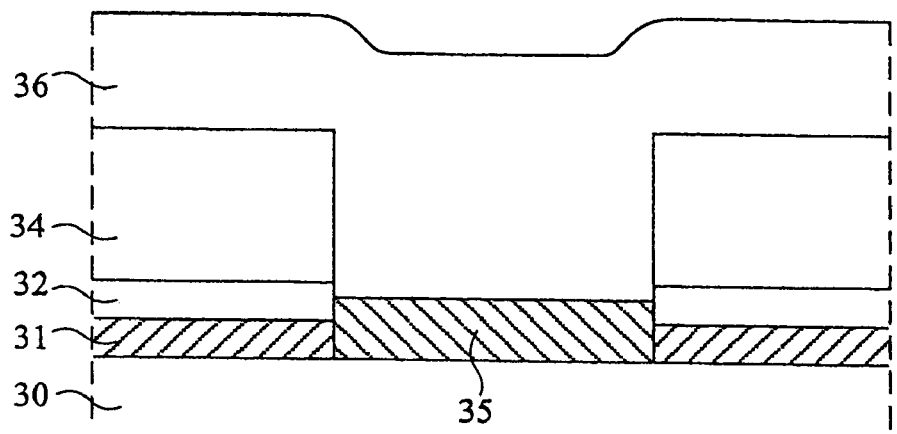

The method carries on, as illustrated in FIG. 3E, with the deposition over the entire structure of at least one conductive layer 36, for example, polysilicon, to completely fill opening 33.

Figure 3F:
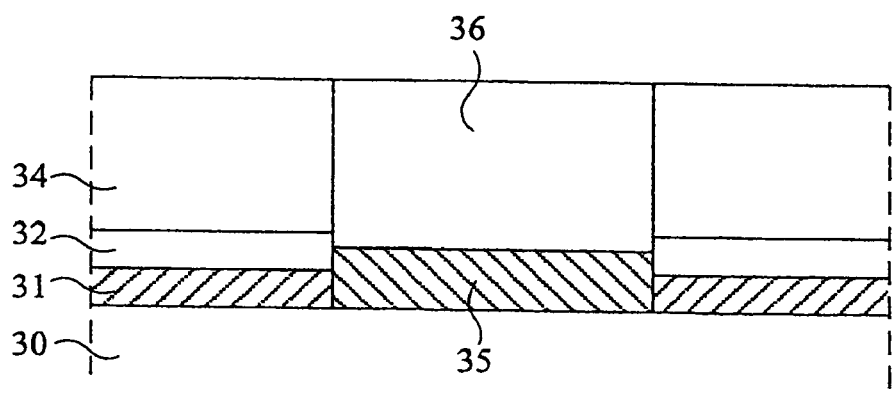

As illustrated in FIG. 3F, a leveling, for example by chem.-mech polishing (CMP) is performed to remove conductive layer 36 from the upper surface of germanium layer 34. Then, germanium layer 34, silicon layer 32, and silicon oxide layer 31 are successively removed by selective etching.

Figure 3G:
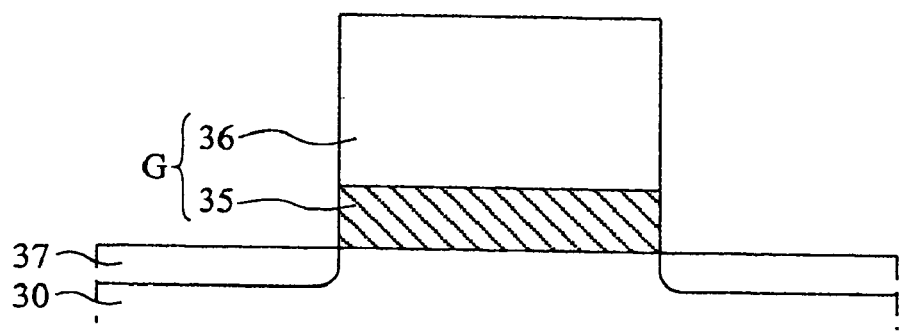

As illustrated in FIG. 3G, gate G formed of a gate electrode 36 insulated from underlying substrate 30 by an insulator 35 of high dielectric permittivity has thus been obtained.

The MOS transistor formation method then carries on, for example, with the forming of lightly-doped drain/source regions (LDD) 37, of spacers, of drain and source regions, and of contacts (not shown).

The method according to the present invention advantageously enables removing the conventional critical gate insulator etch step. It is thus possible to use insulators with a high dielectric permittivity.

Another advantage of the method according to the present invention is that, given the high value of its dielectric permittivity, the control of the inter-electrode insulator thickness is less critical.

Another advantage of the method according to the present invention is to enable use of a method comprising a single mask alignment step. Indeed, the only mask of definition of opening 33 enables defining the gate. Then, the gate forming occurs in self-aligned fashion.

Another advantage of the present invention is to obtain these results with very limited mechanical constraints on the underlying substrate. Indeed, the constraints imposed by a material such as germanium are much less than those exerted by a material such as silicon nitride.

Further, germanium has the advantage of being removable in very selective and mild conditions, even over a thickness of a few hundreds of nanometers.

An embodiment according to which the deposition of the insulator with a high dielectric permittivity 35 is performed selectively only at the bottom of opening 33 and not only on peripheral layer 34 has been described in relation with FIG. 3D. Such a selective deposition is possible, according to the present invention, by implementing an atomic layer chemical vapor deposition (ALCVD) on a silicon surface having undergone a specific preparation. Such a preparation aims at forming a surface comprising many nucleation sites. It may comprise cleaning of the silicon surface capable of leaving in place specific terminations such as OH terminations, in a doping of very low concentration and at low power of selected dopants, or again in the forming of a sacrificial initiation layer.

Thus, in the case of the growth of a zirconium oxide or hafnium oxide layer, it has been shown that the growth selectivity will be obtained by nucleation sites of hydroxide type OH. Such sites are, for example, present in a very large number at the surface of a silicon oxide while they are almost non-existent at the silicon surface.

In the absence of a preliminary preparation, the nucleation sites form during the deposition of the insulator with a high permittivity. In the considered example of zirconium or hafnium oxides, said oxides must start with reacting with the silicon substrate to oxidize it to start their growth.

Experiments of the present inventors have shown that the deposition selectivity between a prepared silicon surface and a germanium surface is very high. Further, most of the preparations enabling causing a growth of a layer of a high-permittivity insulator on a silicon surface have no effect on a germanium surface.

Figure 2:
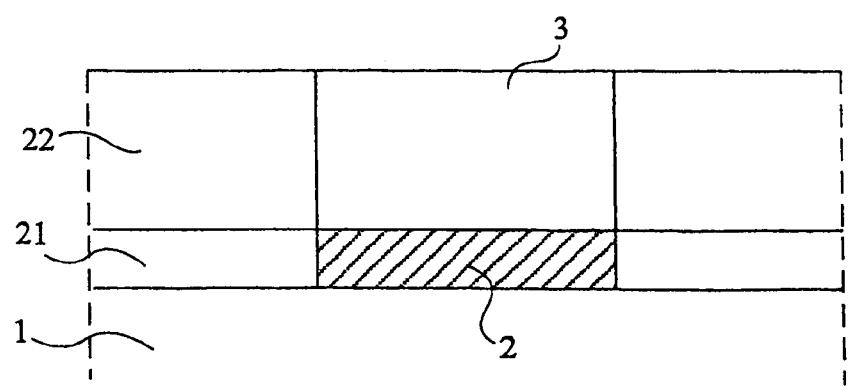
FIG. 2 illustrates, in a simplified partial cross-section view, the state of an insulated gate of a MOS transistor at an intermediary step of its forming according to another known method.

Thus, the presence, at the bottom of opening 33 (FIG. 2C), of very thin silicon oxide layer 31 of the embodiment described in relation with FIG. 3 enables obtaining the desired selectivity.

Figure 1A:
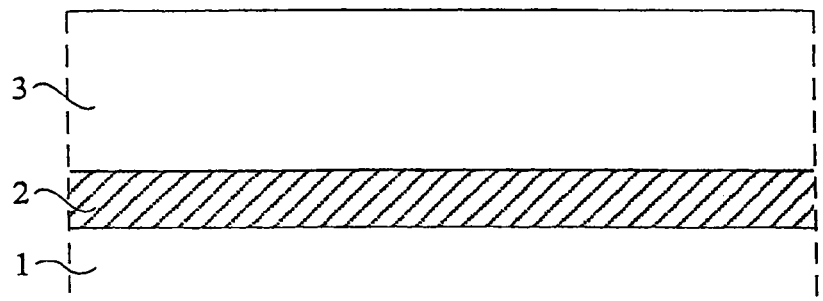
FIGS. 1A and 1B illustrate, in a partial simplified cross-section view, steps of a known method of formation of a MOS transistor insulated gate.
Figure 1B:
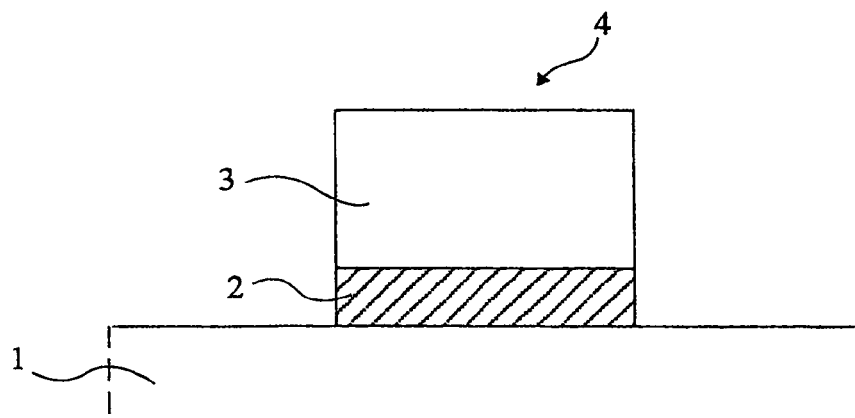

It will be within the abilities of those skilled in the art to adapt the preparation of the surface of substrate 30 at the bottom of opening 33 to the deposited high-permittivity insulator. For example, the nature of layer 31 may be modified. According to other embodiments, after the selective growth of layer 34 around opening 33, layer 31 is removed and a preparation specific to the subsequently deposited insulator 35 is implemented. The preparation may also comprise the deposition, on substrate 30, of an initiation layer specific to the beginning of the method, before deposition (FIG. 1A) of layer 31.

Of course, the present invention is likely to have various alterations, modifications, and improvements which will readily occur to those skilled in the art. In particular, the present invention has been described in the context of the localized forming of an insulating region intended to form the inter-electrode insulator of a capacitive element. However, it will be within the abilities of those skilled in the art to adapt the method according to the present invention to the forming of a localized region of an insulating or conductive material difficult to etch in a given manufacturing process.

Further, the present invention has been described in the case of the forming of insulated MOS transistor gates and of capacitors of MIM type. Those skilled in the art should understand that the present invention applies to the forming of any type of capacitive elements, the inter-electrode dielectric of which is a dielectric of high permittivity, such as insulated dual gates of transistors, capacitors formed directly on a semiconductor substrate or in intermediary levels of an integrated circuit or capacitors of metal-insulator-metal type (MIM) formed in metallization levels. A first conductive electrode may replace the silicon substrate of the preceding description and a second electrode may replace the gate electrode of the previous description.

Moreover, "substrate" has been used to designate in the present description a uniformly-doped silicon wafer as well as areas which are epitaxial and/or specifically doped by implantation/diffusion on or in a solid substrate.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for forming, in an integrated circuit, a localized region of a material difficult to etch, comprising the steps of:
   forming a first silicon oxide layer having a thickness smaller than 1 nm on a silicon substrate;
   depositing, on the first silicon oxide layer, a second layer selectively etchable with respect to the first silicon oxide layer;
   forming in the second layer a first opening according to the pattern of said localized region;
   selectively growing on the second layer, around the first opening, a germanium layer, the material of the second layer being chosen to enable this selective growth of the germanium layer, whereby there exists in the germanium layer a second opening conformable with the first opening;
   depositing the material difficult to etch so that it does not deposit on the germanium layer;
   depositing a conductive layer to fill the opening in the germanium layer;
   performing a leveling to expose the germanium layer; and
   removing the germanium layer, the first silicon oxide layer and the second layer.

2. The method of claim 1, wherein the substrate is made of silicon.

3. The method of claim 1, wherein the second layer is made of amorphous silicon.

4. The method of claim 1, wherein the second layer has a thickness from 2 to 3 nm.

5. The method of claim 1, wherein the first silicon oxide layer has a thickness of from 0.5 to 0.7 nm.

6. The method of claim 1, wherein the germanium layer is deposited from a germane and hydrogen mixture at a temperature from 350 to 650° C.

7. The method of claim 1, wherein the material difficult to etch is an insulator with a high dielectric permittivity selected from the group comprising $MO_2$, $MSi_xO_y$, or $MAl_xO_y$, where x and y designate integers, and M a metal atom selected from the group comprising hafnium, zirconium, lanthanum, and aluminum.

8. The method of claim 1, wherein the deposition of the material difficult to etch is performed by an atomic layer chemical vapor deposition method (ALPCVD).

9. The method of claim 1, wherein the deposition of the material difficult to etch is preceded with a removal of the exposed portion of the first silicon oxide layer at the bottom of the opening and with a processing capable of privileging the growth of the material difficult to etch on the substrate rather than on the germanium layer.

* * * * *